United States Patent
Martin et al.

(10) Patent No.: US 11,432,412 B2
(45) Date of Patent: Aug. 30, 2022

(54) VR/AR SLEEVES

(71) Applicant: HEWLETT-PACKARD DEVELOPMENT COMPANY, L.P., Houston, TX (US)

(72) Inventors: Robert P. Martin, Fort Collins, CO (US); Tom J. Searby, Fort Collins, CO (US); Ashton Ondra, Fort Collins, CO (US); Nathan B. Nuber, Fort Collins, CO (US); Kevin D. Kowalski, Fort Collins, CO (US); Derek Showers, Fort Collins, CO (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 603 days.

(21) Appl. No.: 16/077,080

(22) PCT Filed: Jul. 12, 2017

(86) PCT No.: PCT/US2017/041677
§ 371 (c)(1),
(2) Date: Aug. 10, 2018

(87) PCT Pub. No.: WO2019/013776
PCT Pub. Date: Jan. 17, 2019

(65) Prior Publication Data
US 2021/0185837 A1    Jun. 17, 2021

(51) Int. Cl.
*H05K 5/02* (2006.01)
*G02B 27/01* (2006.01)
*H05K 5/03* (2006.01)

(52) U.S. Cl.
CPC ....... *H05K 5/0204* (2013.01); *G02B 27/0176* (2013.01); *H05K 5/0213* (2013.01); *H05K 5/03* (2013.01); *G02B 2027/0169* (2013.01)

(58) Field of Classification Search
CPC ...... H05K 5/0204; H05K 5/03; H05K 5/0213; G02B 27/0176; G02B 2027/0169
See application file for complete search history.

(56) References Cited

U.S. PATENT DOCUMENTS 5,305,244 A * 4/1994 Newman ................. G06F 1/163
704/E15.045
5,555,490 A * 9/1996 Carroll .................... G06F 1/163
2/905

(Continued)

FOREIGN PATENT DOCUMENTS

EP     0670537 A1    9/1995

OTHER PUBLICATIONS

Akshat Verma, Graphics Card Components & Connectors Explained, Apr. 7, 2017, Graphics Card Hub, Retrieved from web via Internet Archive on Mar. 19, 2021 at: https://web.archive.org/web/20170407074115/https://graphicscardhub.com/graphics-card-component-connectors/ (Year: 2017).*

(Continued)

*Primary Examiner* — Abhishek M Rathod
*Assistant Examiner* — Keith DePew
(74) *Attorney, Agent, or Firm* — Hsuanyeh Law Group PC (57) ABSTRACT

A sleeve for receiving a computing device includes airflow channels. One example sleeve may include a discrete GPU to be connected to the computing device and output signals to a display device.

13 Claims, 5 Drawing Sheets

(56) References Cited

U.S. PATENT DOCUMENTS

| | | | | |
|---|---|---|---|---|
| 5,572,401 | A * | 11/1996 | Carroll | G06F 1/163 429/127 |
| 5,730,342 | A * | 3/1998 | Tien | A45F 5/02 24/3.12 |
| 5,857,600 | A * | 1/1999 | Akutsu | A45F 3/02 224/268 |
| 6,321,959 | B1 * | 11/2001 | Howell | A45F 3/047 224/262 |
| 6,325,262 | B1 * | 12/2001 | Thompson | A45F 3/04 224/628 |
| 6,371,424 | B1 * | 4/2002 | Shaw | F41G 1/54 248/222.12 |
| 6,529,372 | B1 * | 3/2003 | Ng | G06F 1/163 361/728 |
| 6,552,899 | B2 * | 4/2003 | Ronzani | G06F 1/203 361/679.54 |
| 6,956,614 | B1 * | 10/2005 | Quintana | H04N 7/185 348/373 |
| 6,958,905 | B2 * | 10/2005 | Hong | G06F 1/163 361/689 |
| 7,046,214 | B2 * | 5/2006 | Ebersole, Jr. | G02B 27/017 345/7 |
| 7,077,372 | B2 * | 7/2006 | Moran | A61B 90/39 248/221.11 |
| 7,366,925 | B2 | 4/2008 | Keely et al. | |
| 7,458,489 | B1 * | 12/2008 | Mudd | A45F 5/02 224/257 |
| 7,487,896 | B2 * | 2/2009 | Howard, Jr. | A45C 13/02 190/110 |
| 7,978,464 | B2 * | 7/2011 | Daley, III | G06F 1/1628 361/679.02 |
| 8,020,821 | B2 * | 9/2011 | Chen | F16M 13/02 248/221.11 |
| 8,075,202 | B1 * | 12/2011 | Chamberlayne | G03B 17/561 396/423 |
| 8,077,449 | B2 * | 12/2011 | Mi | F16M 13/02 292/216 |
| 8,645,006 | B1 | 2/2014 | Masson | |
| 8,708,583 | B2 * | 4/2014 | Chamberlayne | A45F 5/00 396/423 |
| 8,746,156 | B2 * | 6/2014 | Camarillo | F16M 11/10 108/150 |
| 9,072,364 | B2 * | 7/2015 | Johnson | F16M 13/022 |
| 9,380,728 | B1 * | 6/2016 | Dunwoody | H05K 7/1487 |
| 9,545,549 | B2 | 1/2017 | Soracco et al. | |
| 9,775,426 | B1 * | 10/2017 | Amacker | A45F 3/14 |
| 9,983,624 | B2 * | 5/2018 | Daley, III | H04N 5/64 |
| 10,007,303 | B1 * | 6/2018 | Wang | G06F 1/163 |
| 10,018,300 | B1 * | 7/2018 | De Michele | F16B 21/073 |
| 10,198,029 | B2 * | 2/2019 | Smit | A45F 3/04 |
| D852,423 | S * | 6/2019 | Pennington, Jr. | D29/100 |
| 10,493,355 | B2 * | 12/2019 | Reid | A45F 5/021 |
| 10,527,078 | B2 * | 1/2020 | Bausch | A45F 5/00 |
| 10,641,766 | B2 * | 5/2020 | Mudanyali | H04M 1/72409 |
| 10,663,737 | B1 * | 5/2020 | Magrath | G02B 27/0176 |
| 10,754,380 | B2 * | 8/2020 | Pennington, Jr. | G06F 1/163 |
| 2001/0043164 | A1 * | 11/2001 | Thagard | G09F 21/02 345/7 |
| 2002/0074370 | A1 * | 6/2002 | Quintana | A45F 5/021 224/660 |
| 2002/0144442 | A1 * | 10/2002 | Harasawa | A41D 1/005 40/586 |
| 2002/0180554 | A1 * | 12/2002 | Clark | H05K 7/1452 333/260 |
| 2006/0032882 | A1 * | 2/2006 | Howard, Jr. | A45C 13/02 224/616 |
| 2006/0073723 | A1 * | 4/2006 | Cowgill | H01R 13/6315 439/247 |
| 2006/0113203 | A1 * | 6/2006 | Daley | A45C 5/02 190/110 |
| 2006/0176660 | A1 * | 8/2006 | Amiri | G06F 1/1615 361/679.56 |
| 2008/0040960 | A1 | 2/2008 | Keith | |
| 2008/0120819 | A1 * | 5/2008 | Rene | A41D 13/0012 2/2.5 |
| 2009/0037633 | A1 | 2/2009 | Solomon | |
| 2009/0284908 | A1 * | 11/2009 | Daley, III | G06F 1/1628 361/679.08 |
| 2009/0313748 | A1 * | 12/2009 | Guedes Lopes Da Fonseca | G06Q 10/06 2/87 |
| 2010/0108726 | A1 * | 5/2010 | Hilgenberg | A45C 11/00 206/320 |
| 2011/0157805 | A1 * | 6/2011 | Mi | G06F 1/1613 361/679.22 |
| 2011/0169451 | A1 * | 7/2011 | Stampfli | H04R 1/1033 224/576 |
| 2013/0025021 | A1 * | 1/2013 | Wright | H02S 20/00 136/251 |
| 2015/0208790 | A1 * | 7/2015 | Pylkovas | A45C 13/30 224/578 |
| 2015/0229148 | A1 * | 8/2015 | Icoz | H02J 7/0044 320/137 |
| 2015/0335139 | A1 * | 11/2015 | Orr, Jr. | A45F 5/00 224/222 |
| 2016/0140930 | A1 | 5/2016 | Pusch et al. | |
| 2016/0195681 | A1 * | 7/2016 | Leigh | G02B 6/3849 385/60 |
| 2016/0275722 | A1 * | 9/2016 | Bretschneider | A63F 13/323 |
| 2016/0292918 | A1 * | 10/2016 | Cummings | G06Q 10/103 |
| 2016/0311378 | A1 * | 10/2016 | LaFargue | F16M 13/022 |
| 2016/0314091 | A1 * | 10/2016 | Dutt | G06F 15/7825 |
| 2017/0108892 | A1 * | 4/2017 | Lenzi | A41D 1/002 |
| 2017/0329690 | A1 * | 11/2017 | Cudak | G06F 11/328 |
| 2018/0092455 | A1 * | 4/2018 | Kim | A45F 3/10 |
| 2018/0120897 | A1 * | 5/2018 | Smit | G06F 1/1628 |
| 2018/0248295 | A1 * | 8/2018 | Morral Marti | H01R 13/4534 |
| 2019/0041901 | A1 * | 2/2019 | Pennington, Jr. | G06F 1/163 |
| 2020/0278718 | A1 * | 9/2020 | Steinmark | A41D 1/005 |

OTHER PUBLICATIONS

Gleue et al., "Design and Implementation of a Mobile Device for Outdoor Augmented Reality in the ARCHEOGUIDE Project", The Association for Computing Machinery, Inc., Retrieved from Internet: http://dl.acm.org/citation.cfm?id=585018, 2001, pp. 161-168.

Piekarski et al., "Designing Backpacks for High Fidelity Mobile Outdoor Augmented Reality", IEEE, Computer Scoiety, Proceedings of the Third IEEE and ACM International Symposium on Mixed and Augmented Reality, Retrieved from Internet: http://www.tinmith.net/papers/piekarski-ismar-bp-2004.pdf, 2004, 2 Pages.

* cited by examiner

VR/AR SLEEVES

BACKGROUND

Virtual reality (VR) and augmented reality (AR) comprise the generation and projection of images and text into afield of view of a user. VR and AR devices can include a display component (e.g., glasses) in communication with a computing device. Thus, for instance, the computing device can generate images and text and the display component can display the generated images and text to the user.

BRIEF DESCRIPTION OF THE DRAWINGS

Various examples will be described below by referring to the following figures.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration.

DETAILED DESCRIPTION

Interest and popularity for virtual reality (VR) and augmented reality (AR) systems and devices is ever increasing. VR refers to machine and computer generation of a virtual environment that includes images, video, and audio, and with which users may interact. Interaction with a virtual environment may be enabled by user input via a peripheral user entry device, such as a controller, and sensors (e.g., accelerometers, digital compasses, gyroscopes, magnetometer, satellite positioning systems (SPS), proximity sensors, microphones, cameras, etc.) of the VR device or system. For example, an HMD or other display device may display images and video to simulate an environment within a field of view of a user, and the user may be able to move within the environment and/or interact with objects displayed in the environment. AR systems may provide images and/or video within a user's field of view that may overlay a real world field of view thus providing a composite of virtual and real world views to a user. VR and AR devices and systems (e.g., systems comprising multiple devices, such as a computing device and an HMD) are referred to herein as VR/AR devices, and discussion of one example device (e.g., a VR device) also applies to other example devices (e.g., an AR device) unless indicated otherwise.

In some implementations, VR/AR devices may include a stationary computing device (e.g., a desktop computer) connected to an HMD. For instance, a stationary computing device may be connected to a head mounted display (HMD) via a wired connection, which may limit an ability of a user to move within a virtual or augmented environment. To achieve a more immersive experience, however, VR/AR devices may be portable to allow unimpeded movement in the real world. In one example case, this may be achieved by using a portable computing device (e.g., a laptop) capable of providing graphical data to a display device, such as an HMD.

To achieve device portability there is a desire to reduce a size and weight of VR/AR devices, while also increasing processing power (e.g., operations per second), graphics quality (e.g., resolution, framerate, etc.), and duration of operation (e.g., battery life, etc.), among other things. At times, generating graphics (e.g., images and video) to display for a user via a VR/AR display device may use comparatively more processing power than, for example, general purpose computing tasks such as editing a document or a spreadsheet. As such, powerful computing devices having discrete graphics processing components may provide graphics quality superior to that provided by computing devices with graphics processing integrated into a motherboard (e.g., integrated graphics processing) or performed by a general purpose processor. Discrete graphics processing components may also generate graphics with greater efficiency and/or speed than integrated graphics processing components and general purpose processors. However, processing resources expended to generate graphics (e.g., images and video) may use large amounts of stored charge from a source (e.g., electric power) such as a battery. Thus, graphical processing may potentially reduce a duration of operation of a VR/AR device as compared to general purpose processing. The processing tasks to achieve desired graphical quality may also generate relatively significant heat in the computing device. There may be a desire, therefore, for a device that may be capable of achieving desired graphical quality, while also having adequate operational duration and heat removal (e.g., thermal management).

Figure 1:
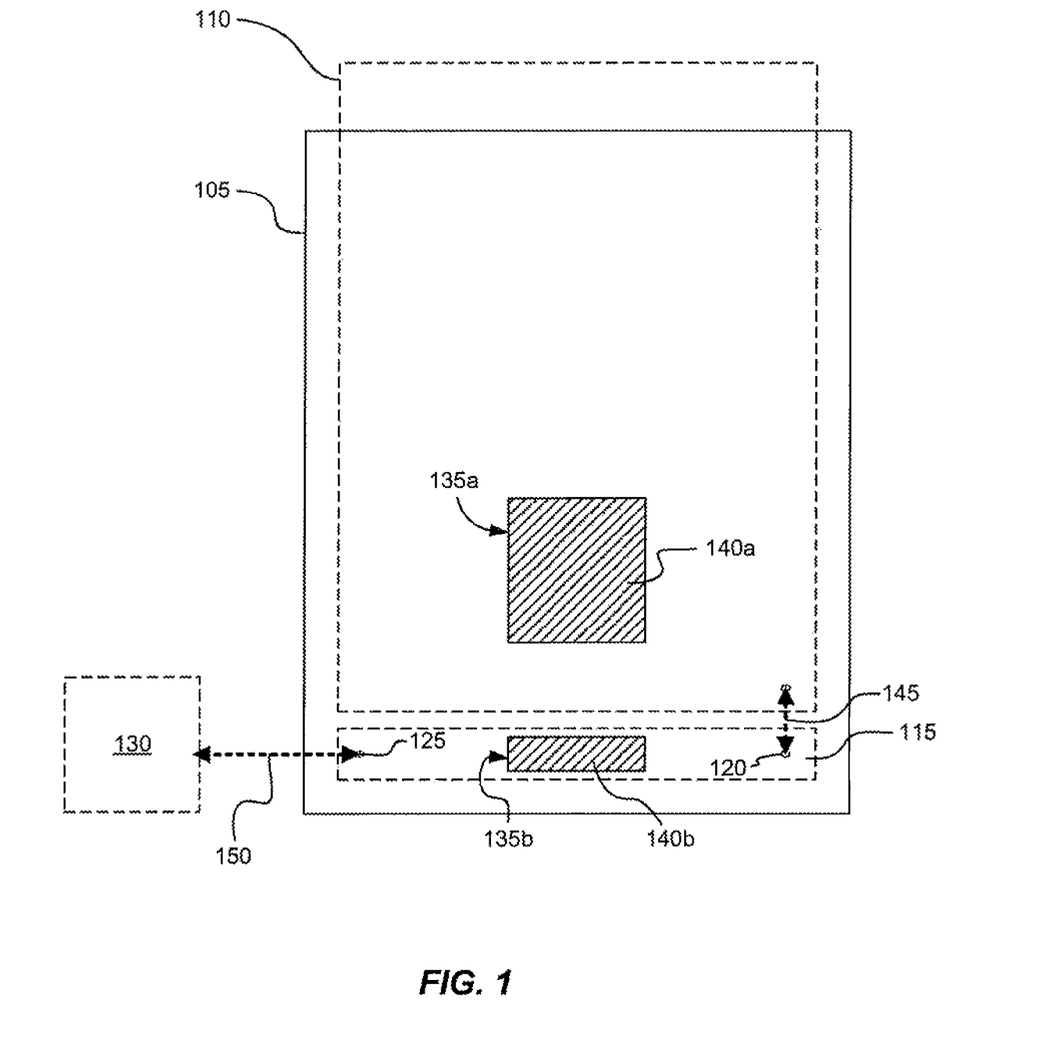
FIG. 1 is a schematic illustration of an example VR/AR device.

An example VR/AR device may include a computing device and a display device. The computing device may be arranged in a portable sleeve to allow a user wearing the sleeve to move without impediment (e.g., Impediment from the computing device, such as a wired connection to a wall electrical outlet) to facilitate an immersive VR/AR experience. FIG. 1 is a schematic diagram illustrating an example sleeve 105 within which may be arranged an example computing device 110. Sleeve 105 may be wearable such as by being attachable to a harness that may be worn by a user. FIG. 1 illustrates computing device 110 arranged within sleeve 105 by using broken lines to indicate the potential presence of computing device 110 (e.g., both within and outside of sleeve 105). For instance, sleeve 105 may have an opening through which computing device 110 may be received, and the portion of computing device received through the opening may not be visible externally. Sleeve 105 may facilitate transmission of signals between computing device 110 and a display device 130 (e.g., an HMD; shown with a broken line), for example. Connections between computing device 110 and display device 130 may be provided within sleeve 105, by way of illustration. Sleeve 105 may also enable the VR/AR experience with desired operational duration and heat removal. For instance, sleeve 105 may comprise airflow channels 135*a* and 135*b* and external sources of electric power (e.g., batteries), as shall be discussed hereinafter.

As noted above, two approaches to graphics processing in a computing device include an integrated graphics processing unit (GPU), which is integrally part of a motherboard of a computing device, and a discrete GPU (e.g., a GPU on a PCIe card installed in a computing device, an external GPU), which comprises a processor and memory that is independent from the processor and memory of the motherboard. For instance, a discrete GPU may have hardware and software that is optimized for graphics processing (e.g., 3D, texturing, shading, etc.) While computing devices intended to run video games and VR/AR experiences may have discrete GPUs, it may be that consumer-grade and enterprise-grade computing devices may have integrated GPUs, which may be ill-suited for VR/AR applications. In one case, such as if computing device 110 has an integrated GPU, an independent GPU 115 may be integrally arranged within sleeve 105. A broken line is used to represent GPU 115 because it may be arranged within sleeve 105 and may not be visible from the exterior.

It is noted that the following description of a discrete GPU (e.g., GPU 115) should not be taken in a limiting sense. Indeed, in one implementation a computing device 110 may comprise a discrete GPU thus rendering GPU 115 superfluous. Nevertheless, returning to an implementation comprising an integrated GPU, and as shall be discussed in greater detail hereinafter, computing device 110 may be connected to GPU 115, such as via a communications channel 145. For instance, a wire or cable may be arranged within sleeve 105 and a user may connect computing device 110 to a first connection port 120 of GPU 115 via the wire or cable. In another example, computing device 110 may engage first connection port 120 without direct human manipulation of connection port 120 and/or any wire or cabling as computing device 110 is slid into sleeve 105 (e.g., a blind-mate connector). Communications channel 145 and first connection port 120 may have sufficient throughput to enable transmission of data for display of images, video, and/or audio. For example, communications channel 145 and first connection port 120 may comprise a THUNDERBOLT (by INTEL Corporation) communications channel comprising signals consistent with PCI Express (PCe) protocol, for example. Thus, for instance, in one case first connection port 120 may comprise a USS Type-C connector to mate with computing device 110 and form a communications channel 145 via which image, video, and/or audio signals may be transmitted between computing device and GPU 115. It is noted that communications channel 145 and first connection port 120 may comprise wired or wireless technology that may yet be developed in the future and that may have throughput sufficient to enable transfer of signals (e.g., for graphical processing) between computing device 110 and GPU 115.

GPU 115 may be capable of processing signals received from computing device 110 and transmitting signals for display by display device 130. GPUs comprise a combination of hardware and software to enable communication with a general purpose processor of a computing device and a display device. In terms of hardware, GPUs comprise electronic circuitry including processors and memory specialized for accelerated manipulation of date to yield images and video to be output to a display device. Because of their specialized nature, GPUs may be capable of more efficiently and quickly generating images and video than general purpose processors, and the resulting generated images and video may be used for VR/AR devices. In one case, display device 130 may comprise a wireless display or HMD. In another case, display device 130 may comprise a wired display or HMD. HMDs refer to a combination of hardware and software including a screen or light projection system for display of images and video generated by a computing device and/or a GPU. HMOs may comprise support structures that may be placed on a head, ears, or shoulders of a user to hold the screen or screens of the HMD in front of the eyes of the user. A communications channel 150 between display device 130 and second connection port 125 may thus comprise a wired or wireless channel via which signals may be transmitted, such that images, video, and/or audio may be transmitted to display device 130 from GPU 115. Display device 130 may receive the generated signals and display images and video. It is noted that while the foregoing discusses the transmission of audio in combination with images and video, in some cases, audio may be transmitted separately to display device 130 (e.g., an HMD).

Computing devices and GPUs performing graphical processing often generate significant amounts of heat. If the heat is not dissipated, a temperature of processors of the computing devices and GPUs may increase outside of an operational range, thus causing malfunction and/or breakage thereof. Thermal dissipation for computing devices and GPUs often calls for adequate space surrounding the computing devices and GPUs for air exchange, even for passively cooled devices. As such, inserting computing devices and GPUs into enclosures may hinder or otherwise impede thermal management of processors of the devices. There may be a desire, therefore, for a sleeve, such as sleeve 105, that may allow dissipation of heat generated by processors of computing device 110 and GPU 115.

Typical approaches to thermal dissipation often are directed to removal of heat from a processor. For example, air cooling can be active (e.g., fans arranged to blow heat away from a processor and pull cooler air into proximity of the processor). Air cooling can also be passive (e.g., heat is allowed to dissipate without use of moving mechanical elements, such as fans). Other approaches to thermal dissipation include liquid cooling, which comprises absorption of heat from a processor by a liquid and pumping the liquid away from the processor. The heat is subsequently removed from the heated liquid, and the removed heat is expelled from the device. In any case, heat is often allowed to exit a device through vents arranged on a housing of the device. It may be desirable, therefore, for sleeve 105 to not impede thermal management of computing device 110 and GPU 115.

In one implementation, airflow channels 135a and 135b may be arranged to correspond to vent 140a of computing device 110 and vent 140b of GPU 115, respectively, such that heat may dissipate from computing device 110 and GPU 115. User comfort considerations may also be taken into account in designing and arranging airflow channels of a sleeve, such as airflow channels 135a and 135b of sleeve 105. For instance, there may be a desire for heated air to be directed away from a portion of sleeve 105 facing a harness onto which sleeve 105 is mounted. To illustrate, if sleeve 105 is mounted on a shoulder and back-mounted harness, airflow channels 135a and 135b may be arranged to direct heated air away from the shoulder and back-mounted harness.

Of course, computing devices often have different thermal management systems and vent locations. In one implementation, sleeve 105 may have airflow channels (e.g., airflow channels 135a and 135b) arranged to allow air to escape from a number of possible vent locations. For instance, air gaps may be arranged between a housing of computing device 110 and an interior surface of sleeve 105, and may be in fluid communication with exit holes in sleeve 105. The air gaps may be arranged such that vents at a number of possible locations of a computing device may be received in the air gaps and pushed out the exit holes. In another implementation, sleeve 105 may be customized for a particular computing device. For instance, airflow channels 135a and 135b may be placed in sleeve 105 to correspond to a particular vent placement of computing device 110.

Figure 2:
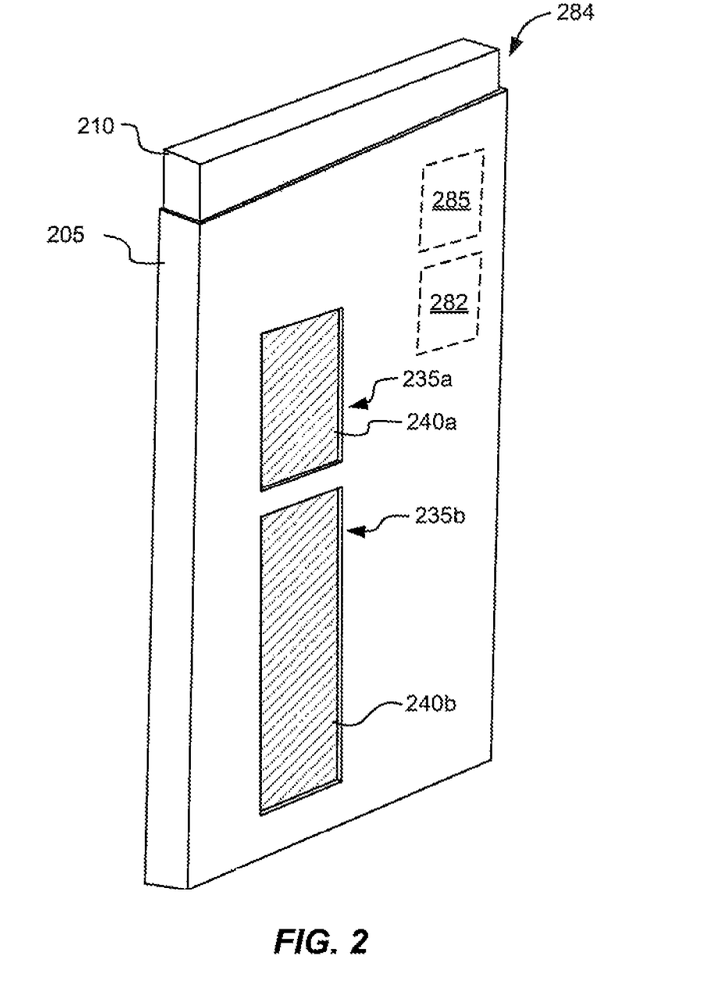
FIG. 2 is a profile view of an example VR/AR device.
Figure 3:
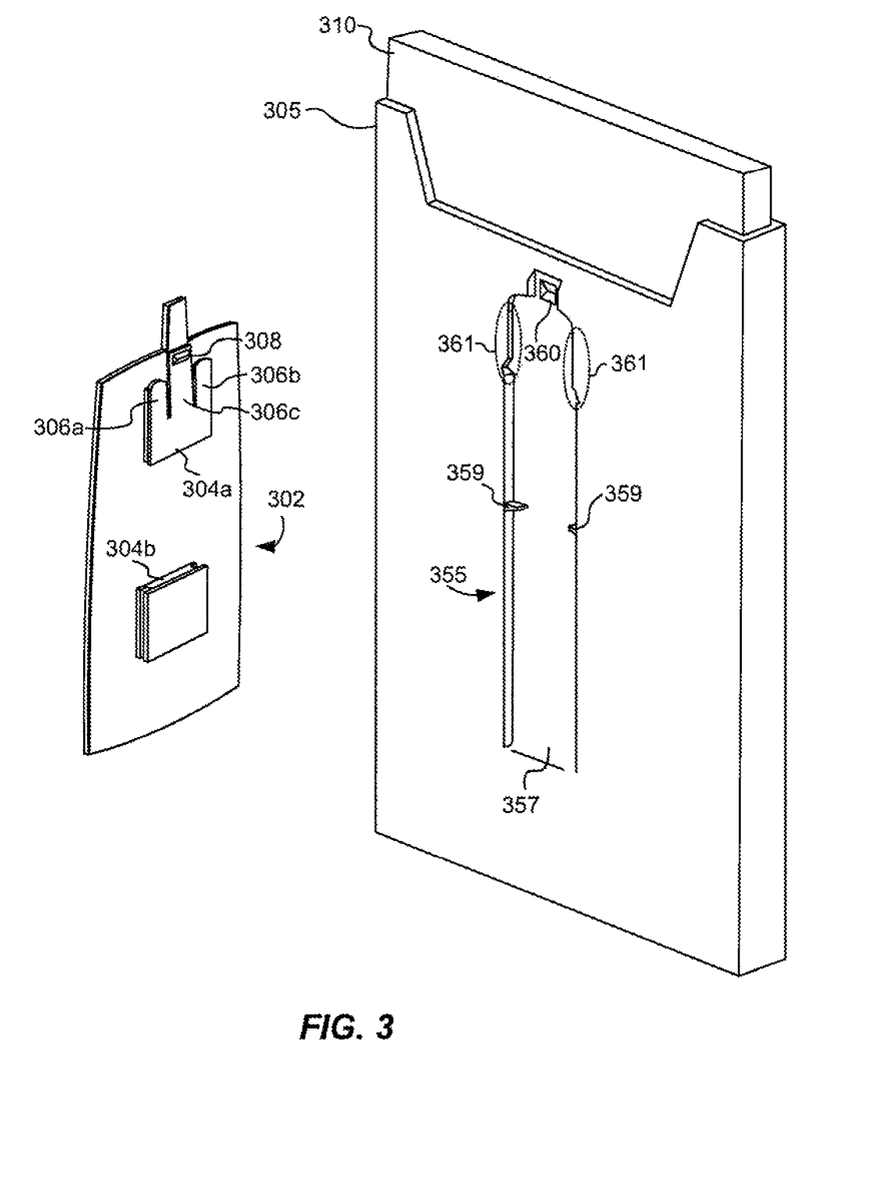
FIG. 3 is a profile view of another example VR/AR device.

FIGS. 2 and 3 present a sample sleeve (sleeve 205 and sleeve 305, respectively). Taking sleeve 205 by way of example, it may comprise a number of possible materials. Sleeve 205 may comprise materials that provide structural stability and may reduce twisting or torqueing of sleeve 205 and/or computing device 210 as compared with a sleeve having soft materials, such as comprising fabrics and foams, by way of example. Sleeve 205 may comprise a rigid structure, for instance, comprising plastics including, but not limited to, polyamides, polycarbonates, polyesters, or polyurethanes, to name but a few options. However, alternatively, more pliable materials may be used to form sleeve 205.

As mentioned above, it may be desirable to have one or more airflow channels 235a and 235b, which may correspond to vents 240a and 240b, respectively, of computing device 210. And furthermore, it may be desirable to arrange airflow channels 235a and 235b so that heated air is directed away from a user. For instance, if a harness mounting mechanism is located on a backside of sleeve 205 (see, e.g., FIG. 3), then heated air may be directed out airflow channels 235a and 235b located on an opposite side of sleeve 205. Airflow channels may also be arranged to allow air to exit on edges or top/bottom faces of sleeve 205. Additionally, in one implementation, airflow channels may be arranged on a same side of sleeve 205 as a harness but may be pointed to direct air away from a harness and a user.

As mentioned briefly above, power management circuitry 285 may be arranged within sleeve 205. For instance, power management circuitry 285 may allow external power sources to connect to sleeve 205, such as via ports on sleeve 205 (not shown). As such, computing device 210 may be able to receive charge from external power sources that may be managed by power management circuitry 285 while computing device 210 is received in sleeve 205 (e.g., through a sleeve opening 284). Sleeve 205 may also include haptic components 282 that may be capable of providing haptic feedback to a user. Thus, a computing device 210 received in sleeve 205 through a sleeve opening 284 may be in electrical contact with a GPU (e.g., GPU 115 of FIG. 1), power management circuitry 285, and haptic components 282. It is noted that the broken lines used to illustrate haptic components 282 and power management circuitry 285 indicate arrangement within sleeve 205 and a lack of external visibility of the elements.

In one implementation, a wearable sleeve may be attachable to and detachable from a harness. FIG. 3 illustrates an example harness mounting bracket 302 onto which sleeve 305 may be mounted. It is noted, however, that the arrangement of features illustrated in FIG. 3 are provided merely by way of example, and a number of other features may be used to attach sleeve 305 to a harness. Turning to the example in FIG. 3, harness mounting bracket 302 has a number of features that may correspond to engagement features of sleeve 305 (e.g., harness engagement mechanism 355). For example, in one implementation, a harness mounting bracket 302 may comprise engagement blocks 304a and 304b that may be capable of engaging a slot 357 of sleeve 305. Engagement blocks 304a and 304b may be capable of sliding within slot 357. Features, such as stops 359, may be arranged in relation to slot 357 in order to maintain a connection between sleeve 305 and a harness, such as via harness mounting bracket 302.

Other features that may be used to attach harness mounting bracket 302 to harness engagement mechanism 355 may include mating prongs 306a-306c and engagement overhangs 361. For instance, mating prongs 306a and 306b may be partially pliable and may be capable of bending to slide underneath engagement overhangs 361. Meanwhile, mating prong 306c may comprise a mating protrusion 308 that may correspond to an indentation 360 at an end of slot 357 of harness engagement mechanism 355. It may be that arranging mating prongs 306a and 306b underneath engagement overhangs 361 may counteract forces that may unintentionally release mating protrusion 308 from indentation 360.

Thus, in operation, attaching sleeve 305 to harness mounting bracket 302 may comprise aligning engagement blocks 304a and 304b within slot 357 such that engagement block 304a is located above stops 359 and below engagement overhang 361 such that prongs 306a and 306b may slide under engagement overhang 361. Once in position within slot 357, sleeve 305 may slide in a downward direction to allow prongs 306a and 306b to engage under engagement overhang 361. Mating protrusion 308 may engage within indentation 360 and engagement block 304b may meet stops 359 at which point harness mounting bracket 302 may be securely attached to harness engagement mechanism 355 of wearable sleeve 305.

Removal of harness mounting bracket 302 may comprise lifting mating prong 306c such that mating protrusion 308 releases from indentation 360 and, while maintaining protrusion 308 free of indentation 360, sliding sleeve 305 upward with respect to harness mounting bracket 302 until a bottom surface of engagement block 304a meets stops 359. At that point, the features of harness mounting bracket 302 may be removed from slot 357.

In one case, attachment of harness mounting bracket 302 and harness engagement mechanism 355 may comprise forming an electric connection between contacts (not shown) on harness mounting bracket 302 and harness engagement mechanism 355, respectively. Consequently, signals may be capable of travelling between a harness connected to harness mounting bracket 302 and a computing device in sleeve 305. Alternatively, and as mentioned above, ports may be arranged on an exterior of sleeve 305 to provide a connection between electrical elements on a harness (e.g., external batteries) and computing device 310.

As noted above, providing graphical processing fora VR/AR device may use relatively large amounts of charge, such as charge stored in a battery. For portable computing devices (e.g., laptops), there may be a desire to prolong VR/AR experience by providing power sources in addition to those included in the computing device. However, some computing devices may not have the ability to manage multiple power sources and optimize power discharge to multiple devices (e.g., computing devices, HMDs, GPUs, etc.). Therefore, there may be a desire for a VR/AR device that may be capable of performing power management functionality.

Figure 4:
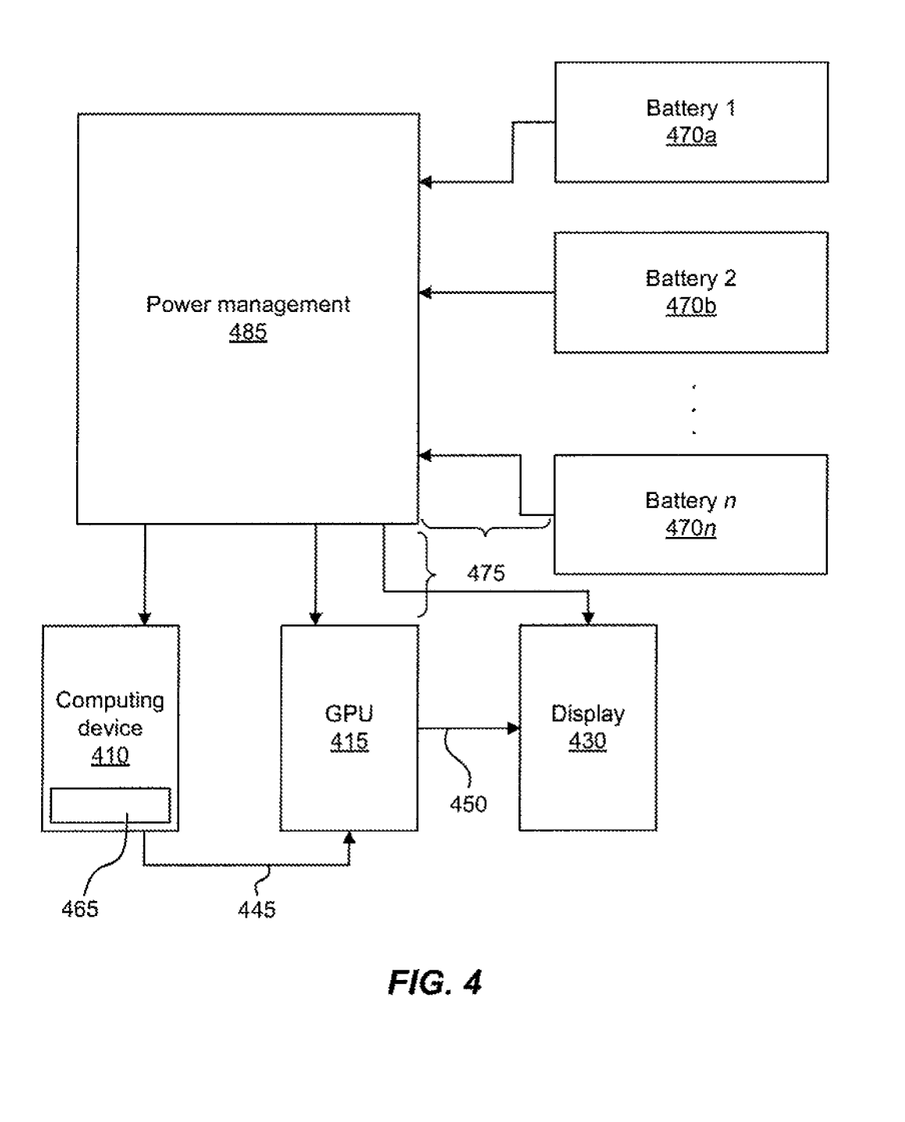
FIG. 4 is a schematic diagram of an example power management system.

FIG. 4 illustrates an example power management system comprising power management circuitry 485. In one case, power management circuitry 485 may be integrated in a sleeve, such as sleeve 205/305 discussed above. The power management system may include transmission channels 475 between batteries 1-n (470a-470n) and also between power management circuitry 485 and computing device 410, GPU 415, and display device 430. Transmission channels 475 may include wired connections between components of FIG. 4 over which stored charge may travel. Furthermore, the transmission channels 475 between power management circuitry 485 and batteries 1-n (470a-470n) may be such that power management circuitry 485 may be capable of measuring characteristics of batteries 1-n. For example, power management circuitry 485 may be capable of determining a charge level for batteries 1-$n$, a rate of discharge, etc. Similarly, power management circuitry 485 may be capable of determining characteristics of computing device 410, GPU 415, and display device 430, such as over transmission channels 475. For instance, power management circuitry 485 may be capable of determining current requirements for computing device 410, GPU 415, and/or display device 430. In one implementation, power management circuitry may determine characteristics of computing device 410, GPU 415, and display device 430 based on communications received, such as from the devices.

Power management circuitry 485 may comprise hardware, software, and combinations thereof (except not software per se) capable of providing functionality, such as balancing current transmission from batteries 1-$n$ and current consumption by attached devices. Hardware may comprise discrete components and/or integrated circuits (e.g., comprising a processor) mounted on a substrate and may have connectors for receiving signals from power sources (e.g., batteries) and connectors for transmitting signals to a computing device, a GPU, and a display, by way of example. In one case, power management circuitry 485 may comprise a number of switches capable of switching power sources and altering loads connected to the power sources. Software may comprise firmware, such as in the form of computer-executable instructions that may be implemented by a processor of power management circuitry 485. The software may be stored in a memory of power management circuitry 485.

In operation, power management circuitry 485 may be capable of monitoring charge levels of multiple power supplies (e.g., battery 1 470$a$, battery 2 470$b$, and battery n 470$n$). Power management circuitry 485 may also be capable of monitoring power consumption of connected devices (e.g., computing device 410, GPU 415, and display device 430). Power management circuitry 485 may be capable of coordinating discharge of the multiple power sources based on device consumption, and may also be able to provide an indication of power level, such as to display device 430, or to an indicator on a sleeve or a harness (not shown).

At times, computing device 410 may comprise its own internal power source, such as internal battery 465. Internal battery 465 may be integrated into a power management system. For instance, internal battery 465 may be used to power computing device 410, and/or may be preserved to provide backup power for times when external batteries run low.

As discussed above, signals for generating images, video, and/or audio may be transmitted between computing device 410 and GPU 415 via a communications channel 445. Similarly, signals representing images, video, and/or audio may be transmitted between GPU 415 and display device 430 via communications channel 450. At times, power may also be transmitted over communications channels 445 and 450, such as using Thunderbolt (or technology analogous thereto). To be clear, similar to as noted above with regards to FIG. 1, an implementation comprising a discrete GPU 415 is presented without limitation. Indeed, in another implementation, a GPU (such as GPU 415) may comprise a GPU in computing device 410 (e.g., a discrete GPU arranged in an enclosure of computing device 410).

It may be desirable to have power management circuitry integrated into a sleeve and harness combination. Such as to provide charge for VR/AR device usage over along duration of time even using computing devices for VR/AR that may not be capable of natively handling multiple external power sources.

As described above, an example power management system may allow batteries to be connected to a harness (e.g., to straps of a harness) and be connected to power management circuitry 485 via wiring running from the harness to a sleeve, such as sleeve 305, to which a computing device may be connected.

As mentioned previously, the use of wiring and cables to connect different devices together may be complex and cumbersome for users. It may also not be aesthetically pleasing to have visible wires exiting and entering a sleeve. Consequently, there may be a desire to have blind-mate connectors arranged within a sleeve such that as a computing device is Inserted into a sleeve, a connection is made with wiring integrated into the shell of the sleeve. Wiring could thus be hidden, and users may avoid a cumbersome process of connecting different components of a VR/AR system.

Figure 5:
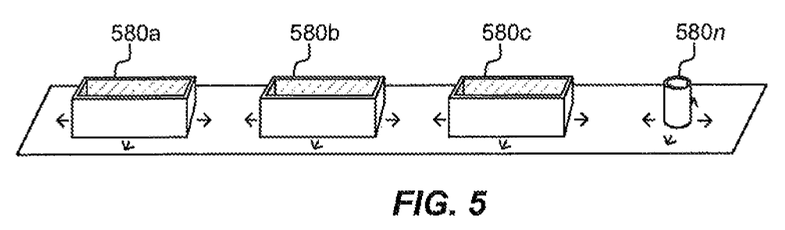
FIG. 5 is a profile view of example blind-mate connectors.

One approach for blind-mate connectors includes the use of connectors that can move along one or more axes (e.g., x- and y-axes) in order to facilitate connections between connectors and ports of a computing device. Such connectors may also be referred to as floating connectors. FIG. 5 illustrates connectors 580$a$-580$n$ as example floating connectors capable of moving along two axes (as illustrated by the arrows surrounding each connector). It is noted that though connectors 580$a$-580$c$ do not show an arrow behind the connectors, this is merely because the connectors obscure the arrow. Connectors 580$a$-580$n$ can still move along two axes. Connectors 580$a$-580$n$ represent a number of different possible connectors, including, but not limited to, USB connectors (including USB type-C), DisplayPort, Thunderbolt, HDMI, power, etc.

In an example implementation, internal wiring, or wiring running internally within a sleeve, may run from a particular connector, such as connector 580$a$, to another device, such as a GPU. Internal wiring may also run from power management circuitry to a connector, such as connector 580$n$, such as to provide electric power to a computing device. Internal wiring may also run from a particular connector, such as connector 580$b$, to another device, such as to a VR controller (e.g., directional pad/stick with buttons). Internal wiring may also run from connector 580$c$ carrying audio signals to another device, such as an HMD. Of course, the foregoing is presented merely by way of example and is not to be taken in a limiting sense.

Connectors 580$a$-580$n$ may be customized for a particular computing device. For instance, different computing devices may have different port arrangements, and connectors 580$a$-580$n$ may be selected and arranged within a sleeve to correspond to those port arrangements.

Figure 6:
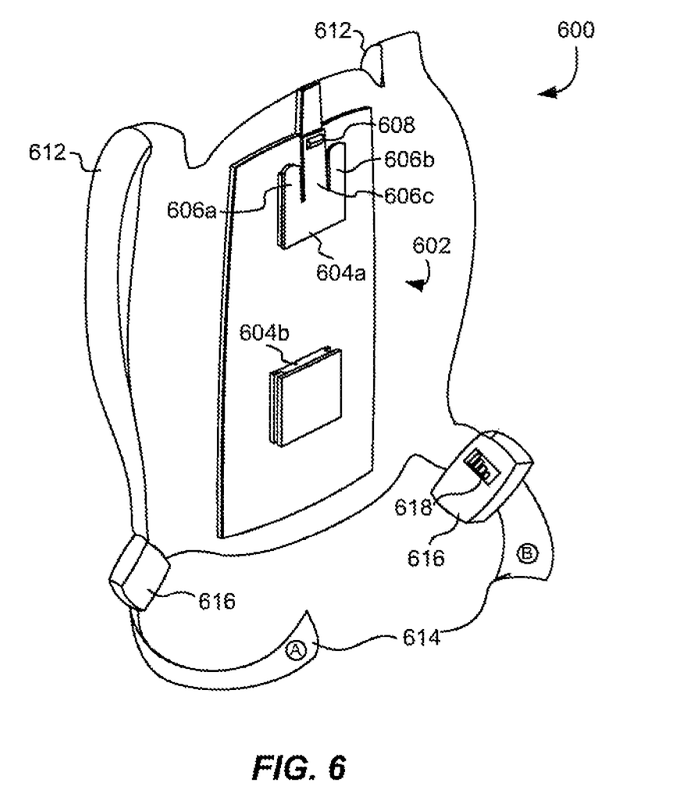
FIG. 6 is a profile view of an example harness.

FIG. 6 illustrates an example harness 600 that may be worn on a back and shoulders of a user. As noted previously, however, other harness implementations are contemplated by the present disclosure (e.g., on a users arm, around a user's waist, etc.). Harness 600 includes harness mounting bracket 602, similar to harness mounting bracket 302, discussed previously, and onto which a sleeve may be attached. Harness mounting bracket may include engagement blocks 604$a$ and 604$b$, and mating prongs 606$a$-$c$, which may correspond to features of a sleeve and may facilitate attachment of the sleeve to harness mounting bracket 602. Power source storage 616 may comprise receptacles (e.g., pockets) into which batteries may be arranged and which may be in electrical communication with a sleeve. In one implementation, power source storage 616 may be connected to contacts on harness mounting bracket 602. An indicator 618 is illustrated to show a charge level of external power sources, and may be in electric communication with a power management system, such as may be integrated into a sleeve attached to harness mounting bracket 602.

Harness 600 may also comprise shoulder straps 612 and waist straps 614 to enable a user to wear a VR/AR device. Shoulder straps 612 may comprise loops through which arms of a user may be passed such that shoulder straps 612 are placed over shoulders of a user. Waist straps 614 may attach together (such as by connecting A and B by use of a fastening mechanism) to provide stability for a sleeve attached to harness 600. In other implementations, harness 600 may be attached to a follow mechanism (e.g., a cart, a robot, etc.) that may be capable of following a user using VR/AR device.

In view of the foregoing, a wearable sleeve that receives a computing device may include a discrete graphics processing unit (GPU) integrally arranged in the sleeve. The GPU may have a first connection port to the computing device and a second connection port to a display device. The sleeve may also have one or more airflow channels to enable dissipation of heated air from the computing device and the GPU out of the sleeve.

The sleeve may have a rigid shell to enclose the computing device, and an opening through which the computing device is to be received. The sleeve may have a harness engagement mechanism arranged to attach the sleeve to a harness. The harness engagement mechanism may have a slot to slidingly receive a harness mounting bracket. And the one or more airflow channels may be integrated into the rigid shell to direct airflow away from the harness engagement mechanism. The rigid shell of the sleeve may also have blind-mate connectors integrated into the interior of the rigid shell.

The sleeve may include a number of hardware and circuitry elements. For instance, it may have a connector to an HMD, and cabling from blind-mate connectors to the HMD may be integrated into the rigid shell. The sleeve may also have power management circuitry to enable transmission of current from a plurality of external power sources to the computing device, the GPU, and the display device. The power management circuitry may include a controller to manager power levels in the plurality of external power sources and current transmitted to the computing device, the GPU, and the display device. In one case, the sleeve may include a connection from the power management circuitry to an HMD. An indicator for battery level may also be provided, and may receive signals from the power management circuitry. Additionally, the sleeve may include one or more haptic elements, such as for providing haptic feedback to users of the VR device.

In another implementation, a VR/AR wearable sleeve for receiving a computing device may include a rigid shell having an opening to receive the computing device and airflow channels to direct heated air away from a harness engagement mechanism arranged on a rear portion of the rigid shell. A plurality of blind-mate connectors (e.g., floating connectors) may be arranged inside the rigid shell to mate with the computing device. The VR/AR wearable sleeve may also include power management circuitry integrated in the rigid shell and arranged to distribute power from a plurality of power sources to the computing device.

In yet another implementation, a VR/AR wearable sleeve and harness, may include a harness comprising a shoulder straps, waist straps, a harness mounting bracket, and power source storage mechanisms. The wearable sleeve may include a rigid shell connected to the harness via the harness mounting bracket. The rigid shell may have an opening to slidingly receive a computing device, and a connection to transmit and receive signals from the power source storage mechanisms. The wearable sleeve may also have power management circuitry integrated into the rigid shell. The power management circuitry may distribute power from power sources located in the power source storage mechanisms to the computing device.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A wearable sleeve to receive a computing device, the sleeve being mountable to a mounting bracket of a user worn harness and comprising:
    a discrete graphics processing unit (GPU) integrally arranged within the sleeve, the discrete GPU having a first connection port to the computing device and a second connection port to a display device;
    an airflow channel to enable dissipation of heated air from the computing device and the discrete GPU out of the sleeve;
    a rigid shell to receive the computing device, and an opening through which the computing device is to be received, wherein the airflow channel is integrated in the rigid shell; and
    a harness engagement mechanism including a slot integrated in the rigid shell to slidingly receive the mounting bracket of the user worn harness;
    wherein, upon reception of the computing device in the rigid shell, a portion of the computer device exposes exterior to the opening of the rigid shell beyond a height of the rigid shell; and
    wherein the slot is configured to receive at least two engagement blocks of the mounting bracket.

2. The sleeve of claim 1, further comprising blind-mate connectors integrated into the interior of the rigid shell.

3. The sleeve of claim 2, further comprising a connector to a head mounted display (HMO), and wherein cabling from the blind-mate connectors to the HMO are integrated into the rigid shell.

4. The sleeve of claim 1, further comprising power management circuitry to enable transmission of current from a plurality of external power sources to the computing device, the discrete GPU, and the display device, the power management circuitry comprising a controller to manage power levels in the plurality of external power sources and current transmitted to the computing device, the discrete GPU, and the display device.

5. The sleeve of claim 4, further comprising an electrical connection between the power management circuitry to a head mounted display (HMO).

6. The sleeve of claim 4, further comprising an indicator for battery level.

7. The sleeve of claim 1, further comprising a haptic element.

8. The sleeve of claim 1, wherein the sleeve is customized for the computing device.

9. A virtual reality/augmented reality (VR/AR) sleeve to receive a computing device, the sleeve being mountable to a mounting bracket of a user worn harness and comprising:
- a rigid shell having an opening to receive the computing device and airflow channels to direct heated air away from the rigid shell;
- a harness engagement mechanism including a slot integrated in the rigid shell to slidingly receive the mounting bracket of the user worn harness;
- a plurality of blind-mate connectors arranged inside the rigid shell to connect to ports of the computing device; and
- power management circuitry integrated in the rigid shell and arranged to distribute power from a plurality of power sources to the computing device;
- wherein, upon reception of the computing device in the rigid shell, a portion of the computer device exposes exterior to the opening of the rigid shell beyond a height of the rigid shell; and
- wherein the slot is configured to receive at least two engagement blocks of the mounting bracket.

10. The sleeve of claim 9, further comprising a graphics processing unit (GPU) arranged within the rigid shell and arranged to transmit signals for display to a head mounted display (HMD), and wherein the airflow channels further comprise airflow channels to direct heated air away from the GPU.

11. The sleeve of claim 10, wherein the power management circuitry is further to distribute power from the plurality of power sources to the GPU.

12. A virtual reality/augmented reality (VR/AR) sleeve and harness, comprising:
- a harness comprising shoulder straps, waist straps, a harness mounting bracket, and power source storage mechanisms;
- a rigid shell having a harness engagement mechanism arranged on a rear portion of the rigid shell that faces a back of a user when the user wears the wearable sleeve, the rigid shell being connected to the harness via the harness mounting bracket, the rigid shell comprising an opening to slidingly receive a computing device, and an electrical connection to transmit and receive signals from the power source storage mechanisms;
- a harness engagement mechanism including a slot integrated in the rigid shell to slidingly receive the harness mounting bracket of the harness; and
- power management circuitry integrated into the rigid shell, the power management circuitry to distribute power from power sources located in the power source storage mechanisms to the computing device;
- wherein, upon reception of the computing device in the rigid shell, a portion of the computer device exposes exterior to the opening of the rigid shell beyond a height of the rigid shell; and
- wherein the slot is configured to receive at least two engagement blocks of the mounting bracket.

13. The VR/AR sleeve and harness of claim 12, further comprising a blind-mate connector to establish the electrical connection upon reception of the computing device in the rigid shell.

* * * * *